US009697895B1

(12) United States Patent
Zaitsu

(10) Patent No.: US 9,697,895 B1
(45) Date of Patent: Jul. 4, 2017

(54) INTEGRATED CIRCUIT

(71) Applicant: KABUSHIKI KAISHA TOSHIBA, Minato-ku (JP)

(72) Inventor: Koichiro Zaitsu, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/265,036

(22) Filed: Sep. 14, 2016

(30) Foreign Application Priority Data

Mar. 17, 2016 (JP) .................................. 2016-054528

(51) Int. Cl.
*G11C 11/16* (2006.01)
*G11C 13/00* (2006.01)

(52) U.S. Cl.
CPC ...... *G11C 13/0064* (2013.01); *G11C 13/0033* (2013.01); *G11C 13/0069* (2013.01)

(58) Field of Classification Search
CPC ............................ G11C 11/16; G11C 13/0069
USPC ................................................ 365/158, 173
See application file for complete search history.

(56) References Cited

U.S. PATENT DOCUMENTS

| 7,495,951 | B1 * | 2/2009 | Taguchi | G11C 13/0007 365/158 |
|---|---|---|---|---|
| 7,986,575 | B2 * | 7/2011 | Inaba | G11C 5/02 365/148 |
| 8,000,127 | B2 * | 8/2011 | Hamilton | B82Y 10/00 365/100 |
| 8,559,208 | B2 * | 10/2013 | Chung | G11C 11/1659 365/148 |
| 8,735,217 | B2 * | 5/2014 | Pham | H01L 45/1608 257/2 |
| 8,767,437 | B2 | 7/2014 | Sasaki | |
| 9,183,931 | B2 * | 11/2015 | Lee | G11C 13/0069 |
| 9,419,217 | B2 * | 8/2016 | Vereen | H01L 27/2454 |
| 9,431,104 | B2 * | 8/2016 | Zaitsu | H03K 19/1776 |
| 2011/0305066 | A1 | 12/2011 | Nazarian et al. | |
| 2014/0215121 | A1 | 7/2014 | Ordentlich et al. | |
| 2016/0078935 | A1 | 3/2016 | Zaitsu | |

(Continued)

FOREIGN PATENT DOCUMENTS

| JP | 2012-169023 | 9/2012 |
|---|---|---|
| JP | 2012-203962 | 10/2012 |
| JP | 2013-537678 | 10/2013 |

(Continued)

*Primary Examiner* — Michael Tran
(74) *Attorney, Agent, or Firm* — Oblon, McClelland, Maier & Neustadt, L.L.P.

(57) ABSTRACT

An integrated circuit according to an embodiment includes: a plurality of first wiring lines; a plurality of second wiring lines intersecting with the plurality of first wiring lines; a plurality of resistive change memory elements provided in cross regions of the plurality of first and second wiring lines, each of which includes a first electrode connected to a corresponding first wiring line, a second electrode connected to a corresponding second wiring line, and a resistive change layer provided between the first and second electrodes, and in each of which a resistive state between the first electrode and the second electrode can be programmed from one of a first resistive state and a second resistive state, which has a larger resistance value than the first resistive state, to the other; and a driver driving the plurality of first and second wiring lines.

19 Claims, 9 Drawing Sheets

(56) References Cited

U.S. PATENT DOCUMENTS

2016/0203860 A1  7/2016  Ho et al.
2016/0276025 A1  9/2016  Tatsumura et al.

FOREIGN PATENT DOCUMENTS

| JP | 2015-5679  | 1/2015  |
| JP | 2016-62627 | 4/2016  |
| JP | 2016-129318 | 7/2016 |
| JP | 2016-178229 | 10/2016 |

* cited by examiner

INTEGRATED CIRCUIT

CROSS REFERENCE TO RELATED APPLICATIONS

This application is based upon and claims the benefit of priority from prior Japanese Patent Application No. 2016-054528 filed on Mar. 17, 2016 in Japan, the entire contents of which are incorporated herein by reference.

FIELD

Embodiments described herein relate generally to an integrated circuit.

BACKGROUND

A resistive change memory element is a non-volatile memory including two electrodes, and a resistive change layer provided between the two electrodes. By applying predetermined voltage between the two electrodes, it is possible to program from a state in which resistance between the electrodes is low (low-resistive state) to a state in which the resistance is high (high-resistive state). Alternatively, it is possible to program from the high-resistive state to the low-resistive state. A resistive state of a resistive change memory element is held even in a state in which power is not supplied. A resistive change memory element can be arranged at each of intersection points of a plurality of word lines and a plurality of bit lines intersecting therewith. A memory cell array in which memory elements are arranged at intersection points of wiring line intersecting in such a manner is called a cross point structure.

In a case of applying a program voltage to a resistive change memory element, a method of limiting current flowing in the resistive change memory element to be equal to or lower than a specific current value. One of purposes of that is to control a resistance value of the resistive change memory element after programming into an intended value. Also, a different purpose is to prevent excessive current from flowing in the resistive change memory element and to prevent breaking of the resistive change memory element.

However, even in a case where the method of limiting current flowing in a resistive change memory element is used as described above, there is still possibility that the resistive change memory element gets broken during programming. When a resistive change memory element is broken, a resistive state of the resistive change memory element is fixed to a low-resistive state and cannot transition to a high-resistive state. Such a resistive change memory element becomes a failure bit and existence of the failure bit causes an operation failure of a circuit.

As a method of relieving a circuit including a failure bit, a technology of previously preparing a redundant bit and replacing the failure bit with the redundant bit is known. However, when the number of failure bits is larger than a certain number in a cell array of a resistive change memory element in the cross point structure, there is a case where it is not possible to relieve a circuit even when replacement with a redundant bit is performed.

In order to prevent a state in which it is not possible to relieve a circuit by replacement with a redundant bit as described above, a technology of making a failure bit transition to a high-resistive state is necessary. However, such a programming method has not known yet.

DETAILED DESCRIPTION

An integrated circuit according to an embodiment includes: a plurality of first wiring lines; a plurality of second wiring lines intersecting with the plurality of first wiring lines; a plurality of resistive change memory elements provided in cross regions of the plurality of first wiring lines and the plurality of second wiring lines, each of which includes a first electrode connected to a corresponding one of the first wiring lines, a second electrode connected to a corresponding one of the second wiring lines, and a resistive change layer provided between the first electrode and the second electrode, and in each of which a resistive state between the first electrode and the second electrode can be programmed from one of a first resistive state and a second resistive state, which has a larger resistance value than the first resistive state, to the other; and a driver configured to drive the plurality of first wiring lines and the plurality of second wiring lines, wherein the driver limits current, which flows in the resistive change memory elements, by using one of a first limit current value and a second limit current value that is larger than the first limit current value, and changes a resistive state of the resistive change memory elements from the first resistive state to the second resistive state.

Before a description of an integrated circuit according to an embodiment, a memory circuit included in an integrated circuit will be described.

Figure 1:
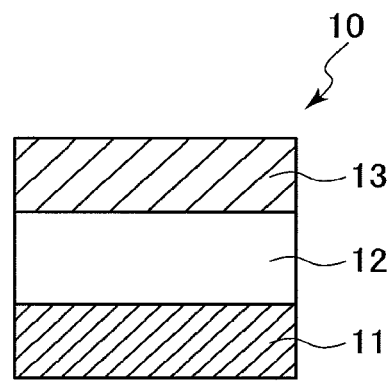
FIG. 1 is a sectional diagram showing a resistive change memory element.

First, a resistive change memory element (hereinafter, also referred to as memory element) will be described. In FIG. 1, a structure of a memory element is illustrated. A memory element 10 includes electrodes 11 and 13, and a resistive change layer 12 sandwiched between these electrodes 11 and 13. The resistive change layer 12 may be, for example, a layer of a metallic oxide such as a titanium oxide, a hafnium oxide, a tantalum oxide, or an aluminum oxide, a layer of a semiconductor oxide such as a silicon oxide, a semiconductor layer of amorphous silicon or the like, or a laminated film including a plurality of layers of these.

By applying predetermined voltage between the electrodes 11 and 13, it is possible to change the memory element from a low-resistive state (state in which resistance between electrode is low) to a high-resistive state (state in which resistance between electrode is high) or from a high-resistive state to the low-resistive state. Here, changing resistance of a memory element from the high-resistive state to the low-resistive state is referred to as setting and changing resistance of a memory element from the low-resistive state to the high-resistive state is referred to as resetting. Also, voltage necessary for setting a memory element is referred to as a set voltage and voltage necessary for resetting a memory element is referred to as a reset voltage. That is, a resistive state of a memory element can be programmed from one of the low-resistive state and the high-resistive state to the other.

As memory elements, there are a unipolar-type memory element and a bipolar-type memory element. In the unipolar-type memory element, a polarity of a set voltage and that of a reset voltage are identical. For example, when voltage higher than voltage applied to an electrode 11 is applied to an electrode 13 in order to set a memory element, the voltage higher than the voltage applied to the electrode 11 is also applied to the electrode 13 in a case of resetting. On the other hand, in the bipolar-type memory element, a polarity of a set voltage and that of a reset voltage are opposite. For example, when voltage higher than voltage applied to an electrode 11 is applied to an electrode 13 in order to set a memory element, voltage lower than the voltage applied to the electrode 11 is applied to the electrode 13 in a case of resetting.

Figure 2:
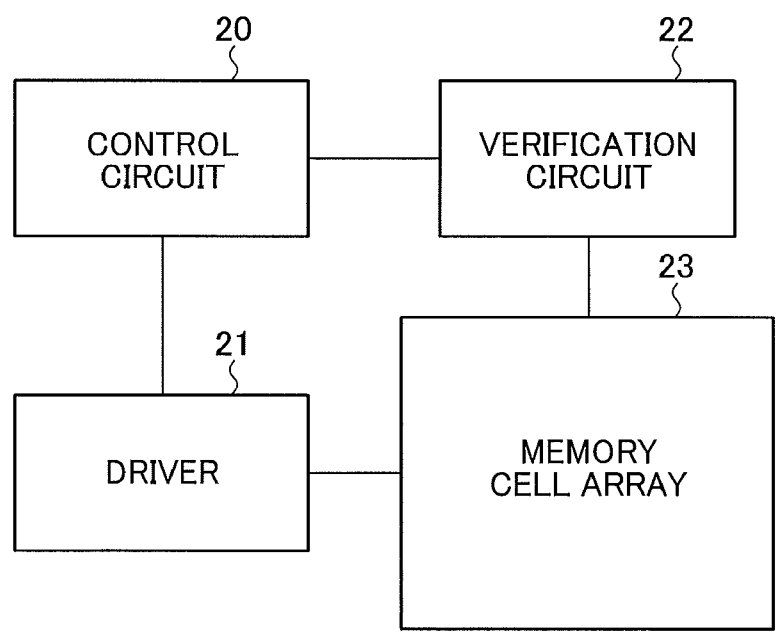
FIG. 2 is a block diagram showing a memory circuit.

An example of a configuration of a memory circuit necessary in a case of programming a memory element is illustrated in FIG. 2. A memory cell array 23 includes a plurality of memory elements arranged in an array and is connected to a driver 21. A control circuit 20 gives the driver 21 control signals such as a signal of giving a command for programming and an address signal of a memory element. The driver 21 applies a program voltage to a selected memory element based on these control signals. Similarly, the driver 21 may apply predetermined voltage to a memory element, which is not selected, based on the control signals or may make potential of an electrode of a specific memory element into a floating state. A verification circuit 22 determines whether a resistance value of a memory element is an intended value (whether programming is completed) and gives information thereof to the control circuit 20. Based on the information from the verification circuit 22, the control circuit 20 transmits a control signal to the driver 21 when necessary.

Incidentally, it is not preferable that excessive current flows in a memory element in programming the memory element. Thus, it is preferable that the driver 21 limits current flowing in a memory element to be equal to or lower than a specific current value in a case of applying a set voltage or a reset voltage to the memory element. In the following, this current value is referred to as a limit current value.

One of purposes of providing a limit current value is to control a resistance value of a memory element after programming into an intended value. For example, a case of setting a memory element will be described as an example. In a case where a set voltage is applied to a memory element in the high-resistive state, current flowing in the memory element is low since resistance of the memory element is high at first. However, when resistance of the memory element gradually becomes low, current flowing in the memory element becomes high accordingly. With this current, a decrease in resistance of the memory element is accelerated. With this acceleration effect, the memory element is rapidly changed to the low-resistive state and often becomes lower than an intended resistance value.

Thus, in order to control resistance of a memory element after a set operation into an intended value, a method of connecting a current limiting element such as a resistor or a transistor to the memory element in series and applying voltage to the memory element through this current limiting element is used. In such a manner, current flowing in the memory element during application of a set voltage is controlled by the current limiting element to be equal to or lower than a limit current value. Thus, it is possible to prevent a decrease in resistance of the memory element from being accelerated as described above. When a limit current value during a set operation becomes larger, that is, when resistance of a current limiting element becomes lower, a resistance value of the memory element after the set operation becomes small.

On the other hand, in a case of resetting a memory, the limit current value is set to be larger than that in the set operation. In other words, resistance of a current limiting element used in a case of applying a reset voltage is lower than resistance of a current limiting element used in a case of applying a set voltage. This is because flowing of adequate current in a memory element is necessary in resetting of the memory element.

A detailed example of a current limiting circuit that limits current flowing in a memory element during application of a program voltage is illustrated in FIG. 3A to FIG. 4B. For example, in a current limiting circuit illustrated in FIG. 3A, one terminal of a current limiting element 30 is connected to one electrode of a memory element 10. A program voltage Vpgm is applied to the other electrode of the memory element 10 and 0 V is applied to the other terminal of the current limiting element 30. The current limiting element 30 has a function of controlling current flowing in the memory element 10 to be equal to or lower than a predetermined value (Icomp).

Figure 3A:
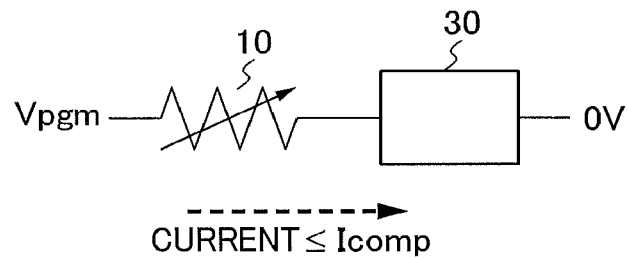
FIG. 3A and FIG. 3B are circuit diagrams showing a current limiting circuit.
Figure 3B:
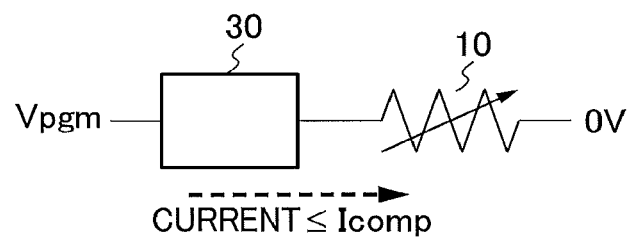

FIG. 3B is a diagram of a different example of a current limiting circuit. One terminal of a current limiting element 30 is connected to one electrode of a memory element 10. 0 V is applied to the other electrode of the memory element 10 and a program voltage Vpgm is applied to the other terminal of the current limiting element 30. Similarly to the example in FIG. 3A, in the current limiting circuit of this example, the current limiting element 30 has a function of controlling current flowing in the memory element 10 to be equal to or lower than a predetermined value (Icomp).

Figure 4A:
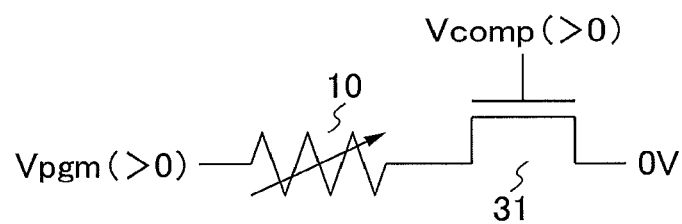
FIG. 4A and FIG. 4B are circuit diagrams showing a current limiting circuit.
Figure 4B:
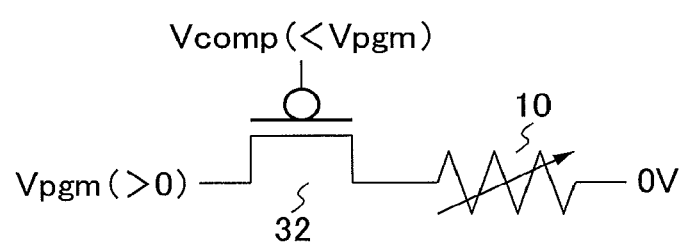

FIG. 4A and FIG. 4B are diagrams of examples of a current limiting circuit in a case where a transistor is used as the current limiting element 30 in FIG. 3. In an example of a current limiting circuit illustrated in FIG. 4A, a drain of an n-type transistor 31 is connected to one electrode of a memory element 10, a program voltage Vpgm is applied to the other electrode of the memory element 10, and 0 V is applied to a source of the transistor 31. A voltage Vcomp is applied to a gate of the transistor 31. By controlling magnitude of the voltage Vcomp, it is possible to control a limit current value. In an example of a current limiting circuit illustrated in FIG. 4B, a drain of a p-type transistor 32 is connected to one electrode of a memory element 10, 0 V is applied to the other electrode of the memory element 10, and a program voltage Vpgm is applied to a source of the transistor 32. In this example, similarly to the example in FIG. 4A, it is possible to control a limit current value by controlling magnitude of the voltage Vcomp applied to the gate of the transistor 32.

Figure 5:
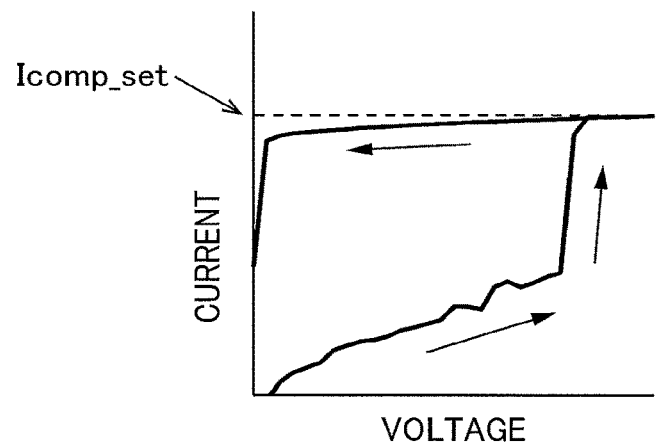
FIG. 5 is a diagram showing a state of a set operation of a unipolar-type memory element.

FIG. 5 is a diagram illustrating a state of a set operation of a unipolar-type memory element. Here, since voltage is applied to a memory element through a current limiting element, current flowing in the memory element is controlled to be equal to or lower than Icomp_set.

Figure 6:
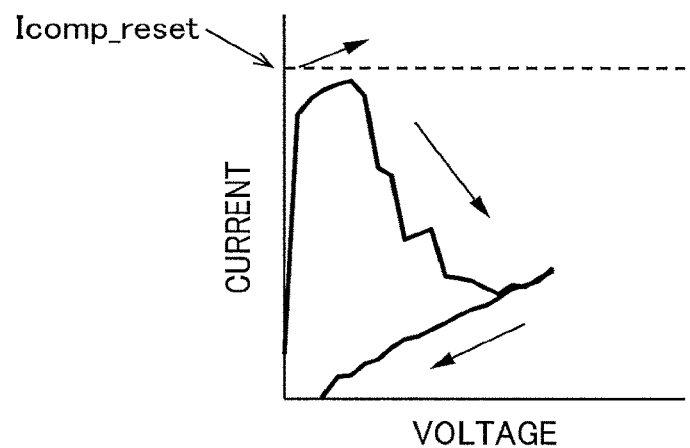
FIG. 6 is a diagram showing a state of a reset operation of the unipolar-type memory element.

FIG. 6 is a diagram illustrating a state of a reset operation of the unipolar-type memory element. Here, resistance of a current limiting element is set in such a manner that current of Icomp_reset at a maximum flows in the memory element. Here, a value of Icomp_reset is set to be larger than a value of Icomp_set described above.

Incidentally, a different purpose of providing a limit current value in a case of programming a memory element is to prevent excessive current from flowing in the memory element and to prevent breaking of the memory element. When a limit current value is not provided in setting of a memory element and flowing of adequately high current into the memory element is permitted, resistance of the memory element after the set operation becomes an extremely low value. In order to reset a memory element with an extremely low resistance value, it is necessary to supply extremely high current to the memory element. However, maximum current that can flow in a memory element is determined according to a writing circuit. In a case where it is not possible to reset a memory element even when this maximum current is supplied, this memory element becomes a failure bit in which a resistive state is fixed to the low-resistive state. Here, a state of being fixed to the low-resistive state is referred to a short-circuit failure state.

In the above example, a case where a limit current value is not provided in a set operation and a memory element becomes the short-circuit failure state has been described. However, generally, a program voltage is applied after a limit current value is set to be small for a certain degree in a set operation. Thus, a memory element hardly becomes the short-circuit failure state due to the set operation. On the other hand, a program voltage is applied after a limit current value is set to be large in a reset operation. Thus, a probability that a memory element is erroneously set and becomes the short-circuit failure state in the reset operation is relatively high.

Figure 7:
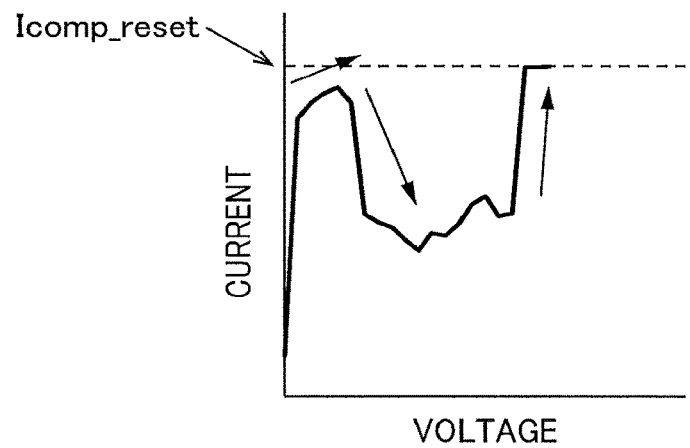
FIG. 7 is a diagram showing a state in which erroneous setting is generated in a case where the unipolar-type memory element performs the reset operation.

FIG. 7 is a diagram showing a state in which erroneous setting is generated in a case where the unipolar-type memory element performs the reset operation. When voltage applied to an electrode of a memory element is increased, current that flows in the memory element is decreased by resetting. However, when the voltage is further increased, the current is rapidly increased due to erroneous setting. Here, since the limit current value is set to adequately high Icomp_reset, resistance of the memory element after the erroneous setting becomes an extremely small value. Such a memory element cannot be changed back to the high-resistive state even when a subsequent reset operation is performed. That is, the memory element becomes the short-circuit failure state.

Figure 8:
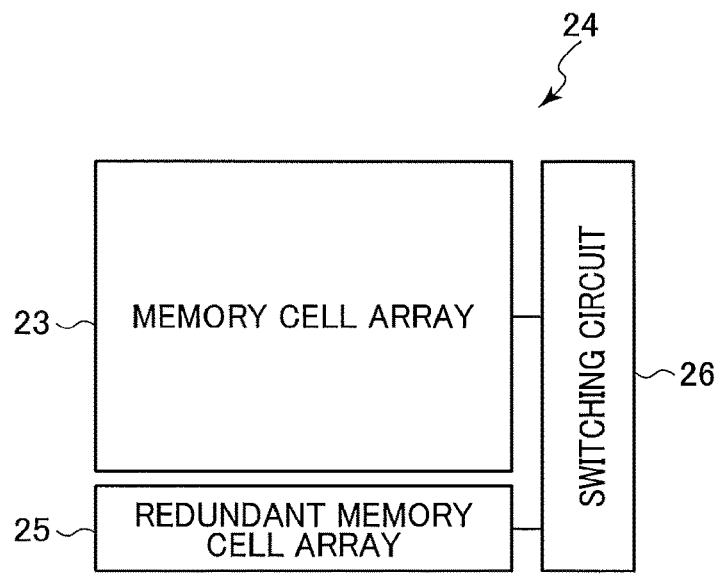
FIG. 8 is a block diagram showing a redundant memory circuit.

When a memory element in a failure state is generated, it is not possible to use the memory element. Thus, there is a case where a technology of performing replacement with an auxiliary memory element is used. That is, a redundant memory element is previously prepared and a memory element in the failure state is replaced with the redundant memory element. FIG. 8 is a diagram showing the concept. A memory cell array 24 includes the memory cell array 23 illustrated in FIG. 2, and a redundant memory cell array 25.

When there is a memory element in the failure state in the memory cell array 23, a switching circuit 26 replaces the part with a memory element in the redundant memory cell array 25.

A failure relieving method using such a redundant memory element is effective to a failure bit fixed to the high-resistive state but may not be effective to a memory in the short-circuit failure state. This is because current flows in an unintended path and it is not possible to correctly read current flowing in a normal memory due to an influence of the current in a case where there is a memory element in the short-circuit failure state. This problem of erroneous reading is not solved even when a memory element in the failure state is replaced with a redundant memory element.

Thus, it is preferable to prevent a memory element from becoming the short-circuit failure state regardless of whether a redundant memory element is prepared or not.

In the following, a method of preventing a memory element from becoming the short-circuit failure state will be described as one embodiment.

Figure 9:
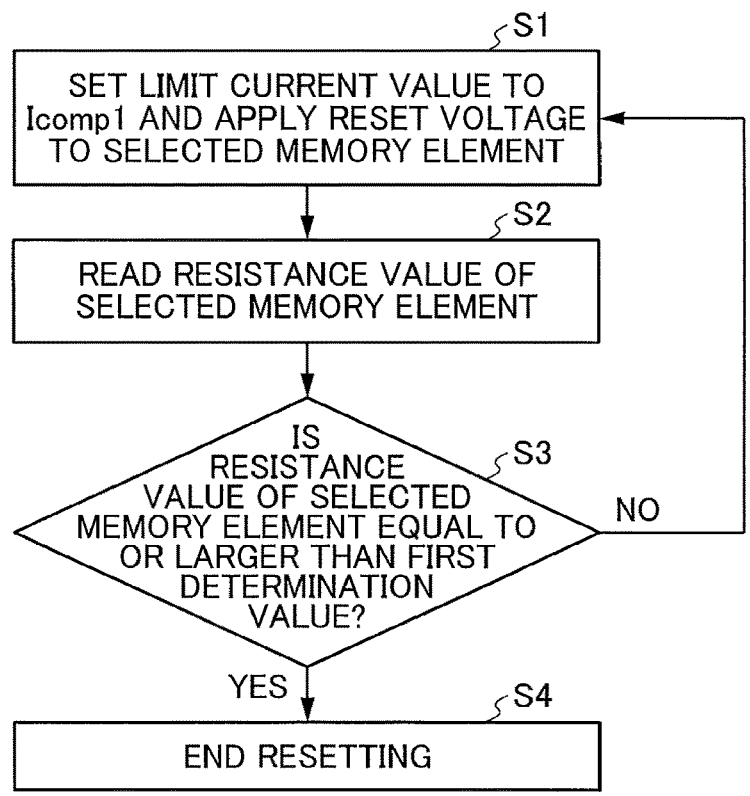
FIG. 9 is a flowchart showing a reset operation of a memory element according to a comparison example.

FIG. 9 is a flowchart showing a procedure of resetting a memory element by a resetting method of a comparison example. First, in a state in which a limit current value is set to a first limit current value Icomp1, a reset voltage is applied to a selected memory element (S1 in FIG. 9). Then, a resistance value of the memory element is read and it is determined by the verification circuit 22 illustrated in FIG. 2 whether the value is equal to or larger than a first determination value (S2 and S3 in FIG. 9). When the resistance value of the memory element is equal to or larger than the first determination value, the reset operation is completed (S4 in FIG. 9).

On the other hand, when the resistance value of the memory element is smaller than the first determination value, the operation goes back to step S1 and a reset voltage is applied to the memory element again. Here, an amount of the applied voltage may be increased or a period of applying the voltage may be increased. Then, a resistance value of the memory element is read again and the above procedure is repeated until the value becomes equal to or larger than the first determination value. By the method illustrated in FIG. 9, there is possibility that a memory element becomes the short-circuit failure state due to erroneous setting in a case of resetting the memory element.

Figure 10:
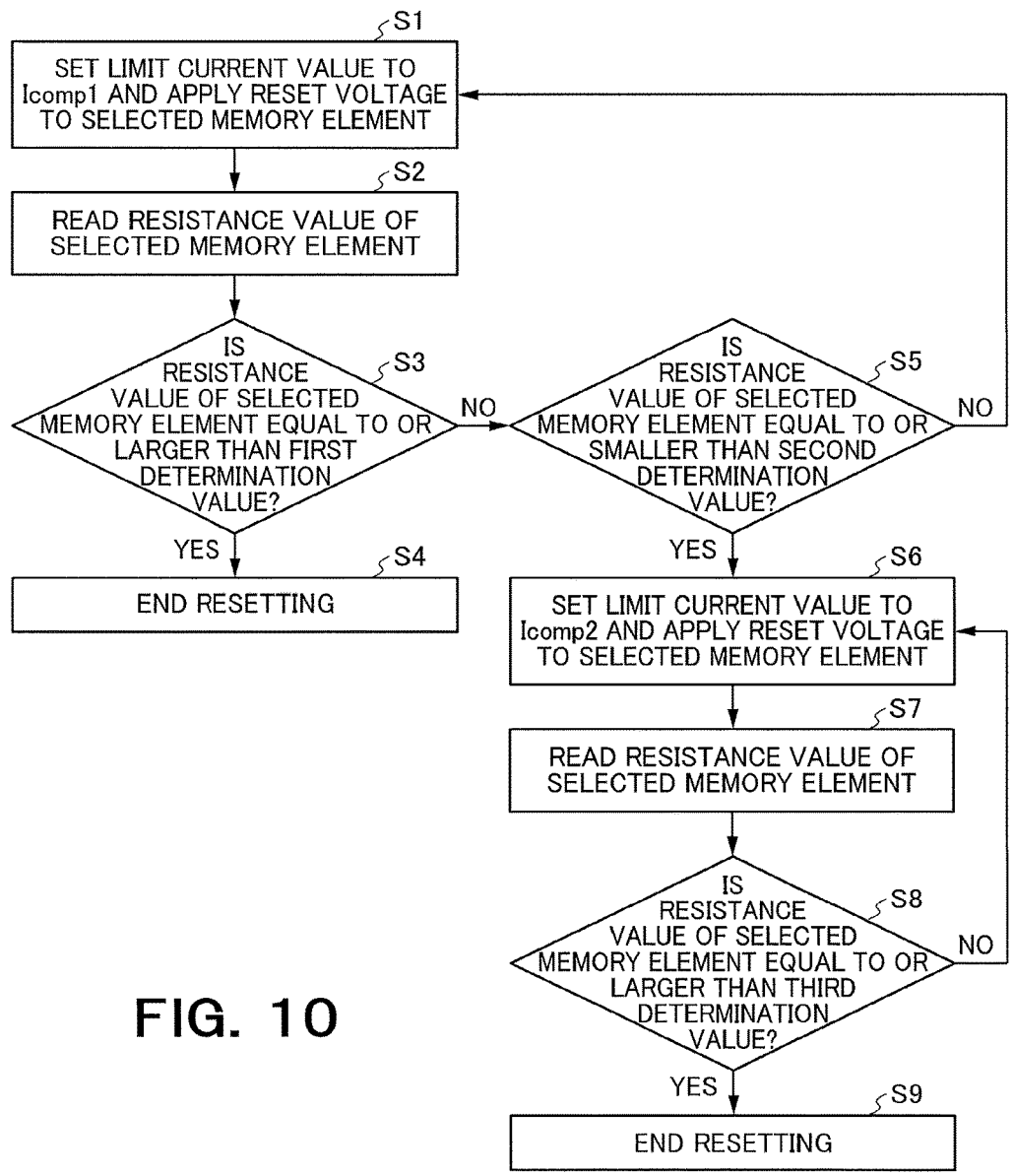
FIG. 10 is a flowchart showing a reset operation of a memory element in a first embodiment.

Next, a resetting method used in an integrated circuit according to a first embodiment described later is illustrated in FIG. 10.

In the resetting method illustrated in FIG. 12, a procedure of changing a memory element, which is erroneously set in a reset operation, back to a high-resistive state is added to the resetting method illustrated in FIG. 10. A first step in the procedure in FIG. 10 is the same with that in the resetting method of the comparison example in FIG. 9. First, in a state in which a limit current value is set to a first limit current value Icomp1, a reset voltage is applied to a memory element (S1 in FIG. 10). Then, a resistance value of a memory element is read and it is determined by the verification circuit 22 illustrated in FIG. 2 whether the value is equal to or larger than a first determination value (S2 and S3 in FIG. 10). When the resistance value of the memory element is equal to or larger than the first determination value, the reset operation is completed (S4 in FIG. 10).

On the other hand, when the resistance value of the memory element is smaller than the first determination value, it is determined by the verification circuit 22 whether the resistance value of the memory element is equal to or smaller than a second determination value (S5 in FIG. 10).

The second determination value used here is a value smaller than the first determination value. When the resistance value of the memory element is larger than the second determination value, the operation goes back to first step S1 and a reset voltage is applied to the memory element in a state in which a limit current value is set to the first limit current value Icomp1.

On the other hand, in a case where the resistance value of the memory element is equal to or smaller than the second determination value, it is determined that the memory element is erroneously set and a reset voltage is applied to the memory element in a state in which a limit current value is set to a second limit current value Icomp2 (S6 in FIG. 10). The limit current value Icomp2 used here is a value larger than the limit current value Icomp1 and the limit current value Icomp2 is preferably a value that is twice of the limit current value Icomp1 or larger.

Then, a resistance value of the memory element is read and it is determined by the verification circuit 22 whether the value is equal to or larger than a third determination value (S7 and S8 in FIG. 10). When the resistance value of the memory element is equal to or larger than the third determination value, the reset operation is completed. On the other hand, when the resistance value of the memory element is smaller than the third determination value, the operation goes back to step S6 and a reset voltage is applied to the memory element again. Here, an amount of the applied voltage may be increased or a period of applying the voltage may be increased. Then, a resistance value of the memory is read again and the above procedure is repeated until the value becomes equal to or larger than the third determination value. The third determination value used here is a value larger than the second determination value. Also, the third determination value and the first determination value may be the same value or different values.

A first characteristic of the resetting method illustrated in FIG. 10 is that two limit current values Icomp1 and Icomp2 with different values (here, Icomp2>Icomp1) can be used in resetting. That is, in resetting, the driver 21 illustrated in FIG. 2 can apply a reset voltage while setting a limit current value to Icomp1 or can apply a reset voltage while setting a limit current value to Icomp2. Also, a second characteristic of the method illustrated in FIG. 10 is that a reset operation is performed with a relatively-small limit current value Icomp1 at first but a reset operation is performed with a relatively-large limit current value Icomp2 with respect to a memory element that is determined to be set erroneously. That is, the driver 21 initially sets a limit current value to Icomp1 and applies a reset voltage to a memory element in resetting. However, when it is determined by the verification circuit 22 that the memory element is erroneously set, the driver 21 sets the limit current value Icomp2 and applies a reset voltage to the memory element.

When the above erroneous setting is generated in a state in which a limit current value is set to Icomp1, current of Icomp1 at a maximum flows in the memory element. Once the current of Icomp1 flows in the memory element, it is necessary to supply current, which is higher than Icomp1, to the memory element in order to change the memory element back to the high-resistive state. However, in the resetting method of the comparison example illustrated in FIG. 9, it is not possible to set a limit current value larger than Icomp1. Thus, it is not possible to change a memory element, which is once set erroneously, back to the high-resistive state again.

However, by the resetting method illustrated in FIG. 10, it is possible to use Icomp2, which is larger than Icomp1, as a limit current value. Thus, even when a memory element is erroneously set in a reset operation, it is possible to change the memory element back to the high-resistive state again.

By using the resetting method illustrated in FIG. 10, it is possible to change a memory element, which is erroneously set during a reset operation, back to a high-resistive state again. However, once a memory element is erroneously set, the number of defects in an inner part of a resistive change layer included in the memory element may be significantly increased compared to that before the erroneous setting. In the memory element having many defects in such a manner, it is considered that voltage necessary for a set operation or a reset operation or a resistance value after the set operation or the reset operation is different from that of a memory element with relatively few defects. Also, a memory element that is once erroneously set may cause erroneous setting again when being kept used even in a case where the memory element is changed back to the high-resistive state.

Thus, in order to improve reliability of a circuit, it is preferable that a memory element, which is once erroneously set, is first changed back to the high-resistive state by the resetting method illustrated in FIG. 10 and is not used thereafter.

Figure 11:
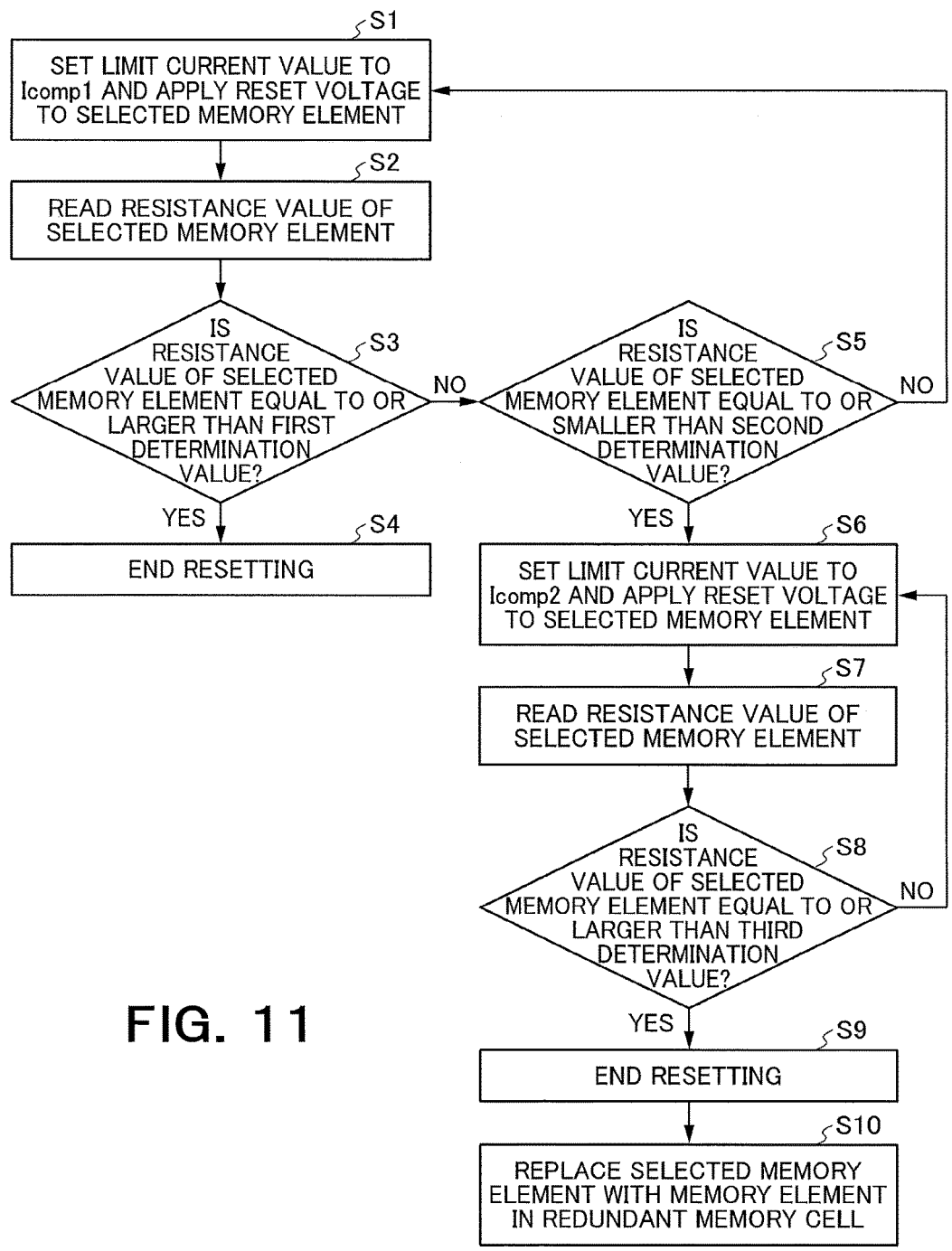
FIG. 11 is a flowchart showing a reset operation of a memory element in a second embodiment.

FIG. 11 is a flowchart showing the method, that is, a method of preventing a memory element from becoming a short-circuit failure state. The method illustrated in FIG. 11 is used in an integrated circuit according to a second embodiment described later and is the resetting method illustrated in FIG. 10 to which method a step of replacing a memory element, in which erroneous setting is generated, with a memory in a redundant memory cell (S10 FIG. 11) is added. That is, in a case where it is determined by a verification circuit 22 that a memory element is erroneously set, a driver 21 sets a limit current value to Icomp2 and applies a reset voltage (S5 and S6 in FIG. 11). Then, a resistance value of a selected memory element is read (S7 in FIG. 11). The read resistance value of the selected memory element and a third determination value are compared with each other by the verification circuit 22. Similarly to the resetting method illustrated in FIG. 10, when the resistance value of the memory element is smaller than the third determination value, the operation goes back to step S6 and the reset voltage is applied to the memory element again (S8 in FIG. 11).

Unlike the resetting method in FIG. 10, in a case where a resistance value of the memory element is equal to or larger than the third determination value, the reset operation is ended and the switching circuit 26 illustrated in FIG. 8 replaces the memory element with a memory element in a redundant memory cell array 25 (S9 and S10 in FIG. 11).

By utilization of the method in FIG. 11, a memory element that is once erroneously set is not used after being changed back to a high-resistive state. Thus, it is possible to improve operation reliability of a memory circuit.

(Current Limiting Element)

Next, an example of a current limiting element that is used in the present embodiment and that can set a plurality of limit current values in a reset operation will be described.

Figure 12A:
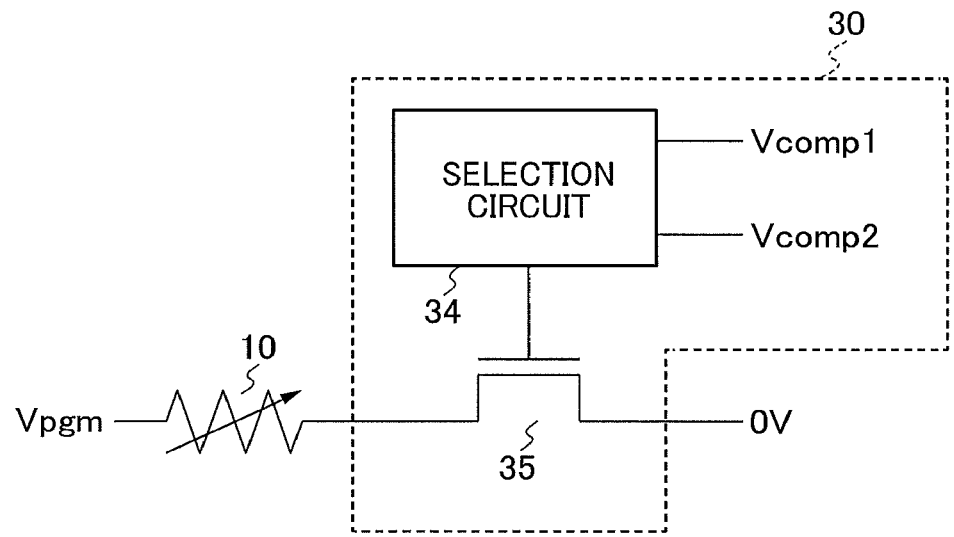
FIG. 12A and FIG. 12B are circuit diagrams showing a current limiting circuit in each embodiment.

FIG. 12A is a diagram showing an example of a current limiting element 30 that can set a plurality of limit current values in a reset operation. A program voltage Vpgm is applied to one electrode of a memory element 10 and 0 V is applied to the other electrode through a transistor 35. A gate of the transistor 35 is connected to at least two kinds of voltages Vcomp1 and Vcomp2 through a selection circuit 34. The selection circuit 34 selects one of Vcomp1 and Vcomp2 and transmits the voltage to the gate of the transistor 35.

Figure 12B:
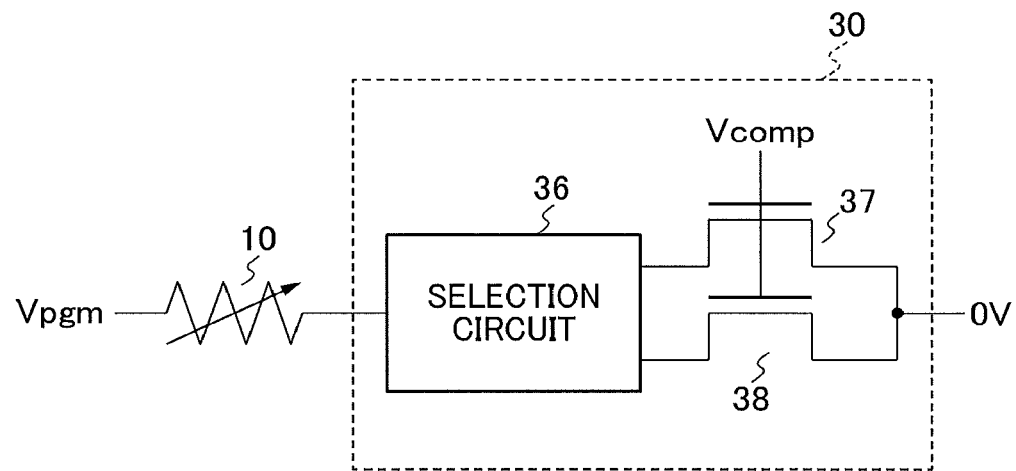

FIG. 12B is a diagram showing a different example of a current limiting element 30 that can set a plurality of limit current values in a reset operation. A program voltage Vpgm is applied to one electrode of a memory element 10 and 0 V is applied to the other electrode through a transistor 37 and a selection circuit 36, through a transistor 38 and a selection circuit 36, or through both of the transistors 37 and 38 and the selection circuit 36. Gates of the transistors 37 and 38 are connected to a common voltage Vcomp. The selection circuit 36 selects one or both of the transistors 37 and 38.

The transistors 37 and 38 may have different sizes or the same size. Note that different voltages may be applied to the gates of the transistors 37 and 38. That is, the gates of the transistors 37 and 38 may be connected to different power supply terminals.

Also, in each of the examples illustrated in FIG. 12A and FIG. 12B, similarly to FIG. 3A, 0 V is applied to the memory element through the current limiting element 30. However, as illustrated in FIG. 3B, Vpgm may be applied to the memory element through the current limiting element 30. In a case of applying Vpgm to a memory through the current limiting element 30, a used transistor such as each of the transistors 35, 37, and 38 illustrated in FIG. 12A and FIG. 12B is preferably a p-type transistor.

First Embodiment

By using the methods described above, it is possible to realize an integrated circuit including a programmable logic circuit that is more reliable than conventional one. The programmable logic circuit includes a plurality of input wiring lines, a plurality of output wiring lines intersecting therewith, and a memory element arranged at each of intersection points of these input wiring lines and the output wiring lines.

Figure 13:
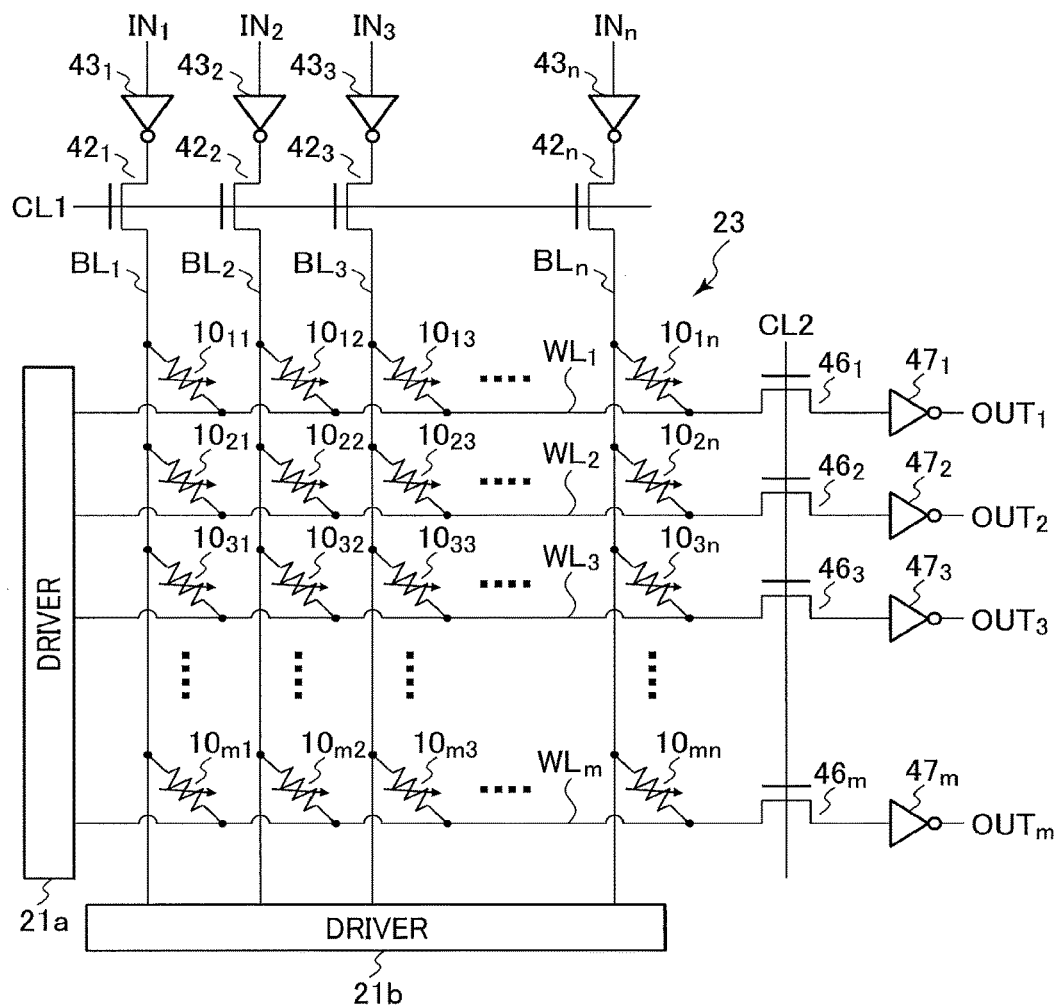
FIG. 13 is a circuit diagram showing an integrated circuit according to the first embodiment.

An integrated circuit according to the first embodiment is illustrated in FIG. 13. The integrated circuit of this embodiment includes a programmable logic circuit. A configuration of this programmable logic circuit is illustrated in FIG. 13. The programmable logic circuit illustrated in FIG. 13 includes a memory cell array 23 having a cross point structure. The memory cell array 23 includes bit lines $BL_1$ to $BL_n$ (n≥1), word lines $WL_1$ to $WL_m$ (m≥1), and memory elements $10_{11}$ to $10_{mn}$ arranged in a cross region of these.

A bit line $BL_j$ (j=1, . . . , n) is connected to an output terminal of a buffer $43_j$ of an inverter or the like through a transistor $42_j$. An input terminal of the buffer $43_j$ is connected to an input line $IN_j$. Similarly, a word line $WL_i$ (i=1, . . . , m) is connected to an input terminal of a buffer $47_i$ of an inverter or the like through a transistor $46_i$ and an output terminal of the buffer $47_i$ is connected to an output line $OUT_i$.

A signal input into the input line $IN_j$ (j=1, . . . , n) is transmitted to the output line $OUT_i$ (i=1, . . . , m) through a memory element in a low-resistive state. Note that here, there may not be the transistor $42_j$ between the bit line $BL_j$ (j=1, . . . , n) and the buffer $43_j$ or the transistor $46_i$ between the word line $WL_i$ (i=1, . . . , m) and the buffer $47_i$. However, by providing these transistors, it is possible to prevent a peripheral circuit such as a buffer from being damaged by a set voltage or a reset voltage in programming of a memory element.

Signals input into the input lines $IN_1$ to $IN_n$ are output from any of the output lines $OUT_1$ to $OUT_m$ through a memory element in the low-resistive state. When a memory element $10_{11}$ in a cross region of the bit line $BL_1$ and the word line $WL_1$ is in the low-resistive state, a signal input into the input line $IN_1$ is output from the output line $OUT_1$. Similarly, when the memory element $10_{11}$ in the cross region of the bit line $BL_1$ and the word line $WL_1$ is in the low-resistive state and a memory element $10_{21}$ in a cross region of the bit line $BL_1$ and the word line $WL_2$ is also in the low-resistive state, a signal input from the input line $IN_1$ is output from both of the output lines $OUT_1$ and $OUT_2$. In order to output a signal, which is input into one input line, from a plurality of output lines, it is necessary to change a plurality of memory elements connected to one bit line into the low-resistive state. On the other hand, signals input into a plurality of input lines are not output from one output line in the programmable logic circuit. Thus, it is not necessary to change a plurality of memory elements connected to one word line into the low-resistive state.

The word line $WL_i$ (i=1, . . . , m) is connected to a driver 21a and the bit line $BL_j$ (j=1, . . . , n) is connected to a driver 21b. In a case of programming a selected memory element, the driver 21a applies predetermined voltage to a word line connected to the selected memory element and the driver 22b applies predetermined voltage to a bit line connected to the selected memory. Also, the driver 21a has a current limiting element and controls current, which flows in the selected memory element, in a case of programming the selected memory element.

In the programmable logic circuit illustrated in FIG. 13, the driver 21a can set a plurality of limit current values Icomp1 and Icomp2 in a case of resetting a selected memory element. Here, Icomp2>Icomp1. Icomp2 is preferably a value that is twice of Icomp1 or larger. Thus, it is possible to apply a reset voltage in a state in which current flowing in a memory element is limited to be equal to or lower than Icomp1 or to apply a reset voltage while setting current flowing in a memory element to be equal to or lower than Icomp2.

Although it is not illustrated in FIG. 13, resistance of a selected memory element can be read by the verification circuit 22 illustrated in FIG. 2. Also, the verification circuit 22 can determine a magnitude relationship between the read resistance of the memory element and a predetermined determination value. As illustrated in FIG. 10, the driver 21a initially resets a memory element in a state in which a limit current value is set to Icomp1. When a resistance value of the memory element becomes equal to or smaller than a second determination value, the driver 21a resets the memory element in a state in which a limit current value is set to Icomp2.

By using the above method, it is possible to change a memory element back to a high-resistive state again even in a case where the memory element is erroneously set during a reset operation. That is, it is possible to prevent the memory element from becoming a short-circuit failure state.

According to the first embodiment, it is possible to prevent a memory element from being fixed to the low-resistive state.

Second Embodiment

Figure 14:
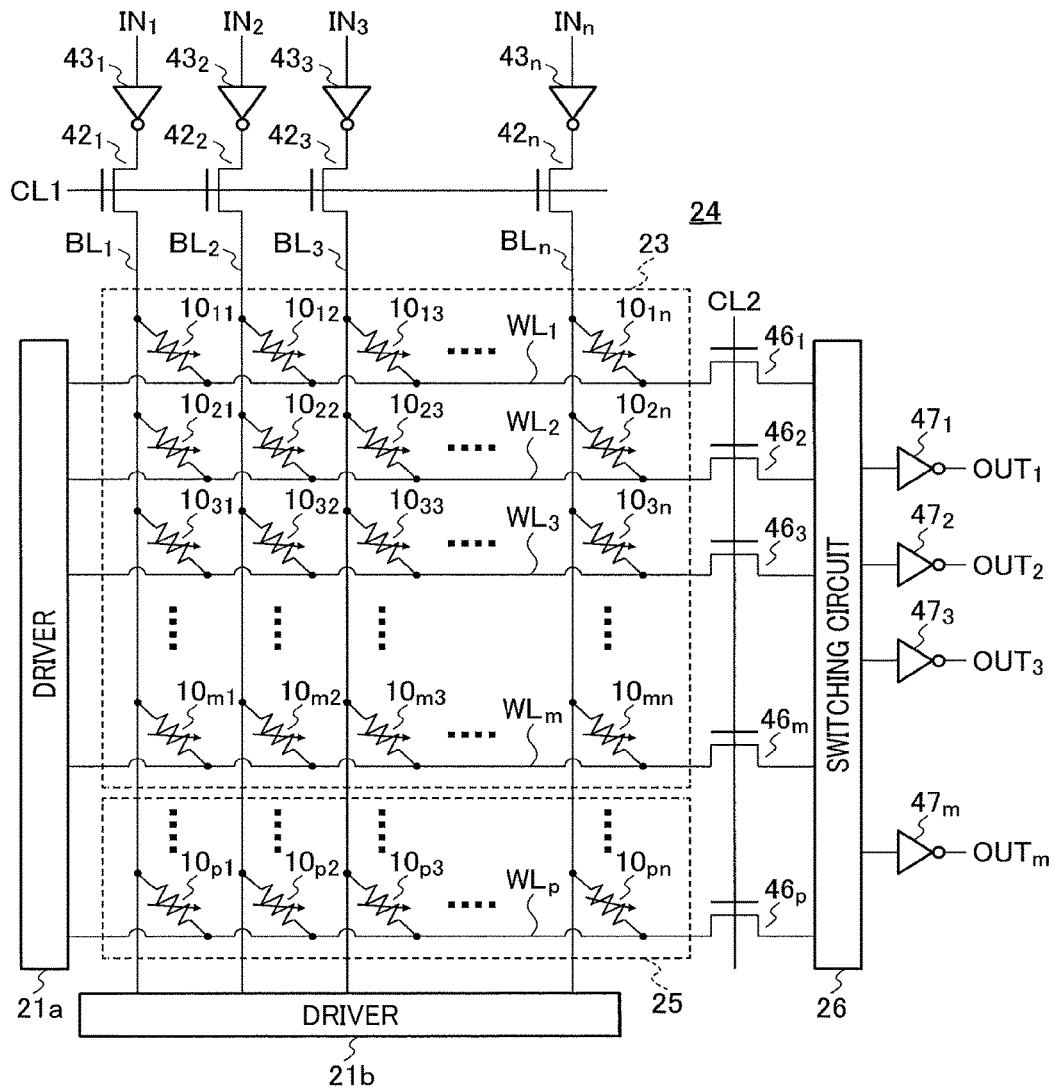
FIG. 14 is a circuit diagram showing an integrated circuit according to the second embodiment.

An integrated circuit according to the second embodiment will be described with reference to FIG. 14. The integrated circuit according to the second embodiment includes a programmable logic circuit. This programmable logic circuit is illustrated in FIG. 14. The programmable logic circuit illustrated in FIG. 14 includes a memory cell array 24 having a cross point structure. Similarly to the circuit illustrated in FIG. 8, the memory cell array 24 includes a memory cell array 23 and a redundant memory cell array 25. Similarly to the first embodiment, the memory cell array 23 includes bit lines $BL_i$ to $BL_n$ (n≥1), word lines $WL_1$ to $WL_m$ (m≥1), and memory elements $10_{11}$ to $10_{mn}$ arranged in a cross region of these. The redundant memory cell array 25 includes bit lines $BL_1$ to $BL_n$ (n≥1), word lines $WL_{m+1}$ to $WL_p$ (p>m), and memory elements $10_{m+11}$ to $10_{pn}$ arranged in a cross region of these.

A bit line $BL_j$ (j=1, . . . , n) is connected to an output terminal of a buffer $43_j$ of an inverter or the like through a transistor $42_j$. An input terminal of the buffer $43_j$ is connected to an input line $IN_j$. Similarly, a word line $WL_i$ (i=1, . . . , p) is connected to a switching circuit 26 through a transistor $46_i$. An input terminal of a buffer $47_i$ (i=1, . . . , m) of an inverter or the like is connected to the switching circuit 26. An output terminal of the buffer $47_1$ is connected to an output line $OUT_i$. That is, the switching circuit 26 includes input terminals corresponding to the word lines $WL_1$ to $WL_p$ and output terminals corresponding to output lines $OUT_1$ to $OUT_m$.

Also, the word line $WL_i$ (i=1, . . . , p) is driven by a driver 21a and the bit line $BL_j$ (j=1, . . . , n) is driven by a driver 21b.

A signal input into the input line $IN_j$ (j=1, . . . , n) is transmitted to the output line $OUT_i$ (i=1, . . . , m) through a memory element in a low-resistive state. Note that here, there may not be the transistor $42_j$ between the bit line $BL_j$ (j=1, . . . , n) and the buffer $43_j$ or the transistor $46_i$ between the word line $WL_i$ (i=1, . . . , p) and the switching circuit 26. However, by providing these transistors, it is possible to prevent a peripheral circuit such as a buffer from being damaged by a set voltage or a reset voltage in programming of a memory element.

The switching circuit 26 selects m word lines from the plurality of word lines $WL_1$ to $WL_p$ (1≤m<p) and connects these lines to the output lines $OUT_1$ to $OUT_m$.

When there is a memory element that is erroneously set in a reset operation in the memory cell array 24, the memory element is not used after being changed to a high-resistive state by utilization of the above resetting method. That is, after an erroneously-set memory element is changed to the high-resistive state, the switching circuit 26 selects a word line other than a word line connected to the memory element.

Similarly to the first embodiment, with this second embodiment, it is possible to prevent a memory element from being fixed to the low-resistive state.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An integrated circuit comprising:
   a plurality of first wiring lines;
   a plurality of second wiring lines intersecting with the plurality of first wiring lines;
   a plurality of resistive change memory elements provided in cross regions of the plurality of first wiring lines and the plurality of second wiring lines, each of which includes a first electrode connected to a corresponding one of the first wiring lines, a second electrode connected to a corresponding one of the second wiring lines, and a resistive change layer provided between the first electrode and the second electrode, and in each of which a resistive state between the first electrode and the second electrode can be programmed from one of a first resistive state and a second resistive state, which has a larger resistance value than the first resistive state, to the other;
   a driver configured to drive the plurality of first wiring lines and the plurality of second wiring lines; and
   a verification circuit connected to the plurality of first wiring lines or the plurality of second wiring lines, and comparing resistance of the resistive change memory elements with a first determination value,
   wherein the driver limits current, which flows in the resistive change memory elements, by using one of a first limit current value and a second limit current value that is larger than the first limit current value, and changes a resistive state of the resistive change memory elements from the first resistive state to the second resistive state.

2. The circuit according to claim 1, wherein the driver limits current flowing in the resistive change memory elements to be equal to or lower than the first limit current value, and limits the current flowing in the resistive change memory elements to be equal to or lower than the second limit current value and changes the resistive state of the resistive change memory elements from the first resistive state into the second resistive state after the verification circuit determines that resistance of the resistive change memory elements is equal to or lower than the first determination value.

3. The circuit according to claim 2, wherein the plurality of first wiring lines is connected to a plurality of input wiring lines to which a signal is input, the plurality of second wiring lines is connected to a plurality of output wiring lines from which a signal is output, and the signal input into the plurality of input wiring lines is output from at least one of the plurality of output wiring lines through one of the plurality of resistive change memory elements which one is in the first resistive state.

4. The circuit according to claim 1, wherein the second limit current value is twice of the first limit current value or larger.

5. The circuit according to claim 1, wherein the driver includes a first transistor a source or a drain of which is connected to one of the first and second electrodes of each of the resistive change memory elements, and a selection circuit including an input terminal connected to one of a first power supply terminal and a second power supply terminal, and an output terminal connected to a gate of the first transistor.

6. The circuit according to claim 1, wherein the driver includes a first transistor a source of which is connected to a first power supply terminal, a second transistor a source of which is connected to a second power supply terminal, and a selection circuit that is connected between drains of the first transistor and the second transistor and one of the first electrode and the second electrode of each of the resistive change memory elements and that connects at least one of the drain of the first transistor and the drain of the second transistor to one of the first and second electrodes of each of the resistive change memory elements.

7. The circuit according to claim 1, wherein the plurality of first wiring lines is connected to a plurality of input wiring lines to which a signal is input, the plurality of second wiring lines is connected to a plurality of output wiring lines from which a signal is output, and the signal input into the plurality of input wiring lines is output from at least one of the plurality of output wiring lines through one of the plurality of resistive change memory elements which one is in the first resistive state.

8. The circuit according to claim 1, wherein in each of the plurality of resistive change memory elements, resistance between the first electrode and the second electrode is changed from the first resistive state to the second resistive state by application of voltage, which is higher than a voltage applied to the second electrode, to the first electrode, and resistance between the first electrode and the second electrode is changed from the second resistive state to the first resistive state by application of voltage, which is higher than a voltage applied to the second electrode, to the first electrode.

9. The circuit according to claim 1, wherein in each of the plurality of resistive change memory elements, resistance between the first electrode and the second electrode is changed from the first resistive state to the second resistive state by application of voltage, which is lower than a voltage applied to the second electrode, to the first electrode, and resistance between the first electrode and the second electrode is changed from the second resistive state to the first resistive state by application of voltage, which is lower than a voltage applied to the second electrode, to the first electrode.

10. An integrated circuit comprising:
a plurality of first wiring lines;
a plurality of second wiring lines intersecting with the plurality of first wiring lines;
a plurality of resistive change memory elements provided in cross regions of the plurality of first wiring lines and the plurality of second wiring lines, each of which includes a first electrode connected to a corresponding one of the first wiring lines, a second electrode connected to a corresponding one of the second wiring lines, and a first resistive change layer provided between the first electrode and the second electrode, and in each of which a resistive state between the first electrode and the second electrode can be programmed from one of a first resistive state and a second resistive state, which has a larger resistance value than the first resistive state, to the other;
a plurality of third wiring lines that is fewer than the plurality of second wiring lines;
a switching circuit that is connected between the plurality of second wiring lines and the plurality of third wiring lines; and
a driver configured to drive the plurality of first wiring lines and the plurality of second wiring lines,
wherein the driver limits current, which flows in the resistive change memory elements, by using one of a first limit current value and a second limit current value that is larger than the first limit current value, and changes a resistive state of the resistive change memory elements from the first resistive state to the second resistive state.

11. The circuit according to claim 10, further comprising a verification circuit that is connected to the plurality of first wiring lines or the plurality of second wiring lines and that compares resistance of the resistive change memory elements with a first determination value.

12. The circuit according to claim 11, wherein the driver selects a resistive change memory element from the plurality of resistive change memory elements, limits current flowing in the selected resistive change memory element to be equal to or lower than the first limit current value, limits the current flowing in the selected resistive change memory element to be equal to or lower than the second limit current value and changes a resistive state of the selected resistive change memory element from the first resistive state into the second resistive state after the verification circuit determines that resistance of the selected resistive change memory element is equal to or lower than the first determination value, and the switching circuit subsequently selects a wiring line other than a wiring line, to which the selected resistive change memory element is connected, from the plurality of second wiring lines and connects the selected wiring line to the plurality of third wiring lines.

13. The circuit according to claim 12, wherein the plurality of first wiring lines is connected to a plurality of input wiring lines to which a signal is input, the plurality of second wiring lines is connected to an input terminal of the switching circuit, and an output terminal of the switching circuit is connected to the plurality of third wiring lines.

14. The circuit according to claim 10, wherein the second limit current value is twice of the first limit current value or larger.

15. The circuit according to claim 10, wherein the driver includes a first transistor a source or a drain of which is connected to one of the first and second electrodes of each of the resistive change memory elements, and a selection circuit including an input terminal connected to one of a first power supply terminal and a second power supply terminal, and an output terminal connected to a gate of the first transistor.

16. The circuit according to claim 10, wherein the driver includes a first transistor a source of which is connected to a first voltage, a second transistor a source of which is connected to the first voltage, and a selection circuit that is connected between drains of the first transistor and the second transistor and one of the first electrode and the second electrode of each of the resistive change memory elements and that connects at least one of the drain of the first transistor and the drain of the second transistor to one of the first and second electrodes of each of the resistive change memory elements.

17. The circuit according to claim 10, wherein the plurality of first wiring lines is connected to a plurality of input wiring lines to which a signal is input, the plurality of second wiring lines is connected to an input terminal of the switching circuit, and an output terminal of the switching circuit is connected to the plurality of third wiring lines.

18. The circuit according to claim 10, wherein in each of the plurality of resistive change memory elements, resistance between the first electrode and the second electrode is changed from the first resistive state to the second resistive state by application of voltage, which is higher than a voltage applied to the second electrode, to the first electrode, and resistance between the first electrode and the second electrode is changed from the second resistive state to the first resistive state by application of voltage, which is higher than a voltage applied to the second electrode, to the first electrode.

19. The circuit according to claim 10, wherein in each of the plurality of resistive change memory elements, resistance between the first electrode and the second electrode is changed from the first resistive state to the second resistive state by application of voltage, which is lower than a voltage applied to the second electrode, to the first electrode, and resistance between the first electrode and the second electrode is changed from the second resistive state to the first resistive state by application of voltage, which is lower than a voltage applied to the second electrode, to the first electrode.

\* \* \* \* \*